United States Patent [19]

Ikeno et al.

[11] Patent Number: 4,886,012
[45] Date of Patent: Dec. 12, 1989

[54] SPIN COATING APPARATUS

[75] Inventors: Masahiko Ikeno; Hiroshi Kawashima; Osamu Kaneda, all of Itami, Japan

[73] Assignee: Mitsubishi Denki Kabushiki Kaisha, Japan

[21] Appl. No.: 212,229

[22] Filed: Jun. 27, 1988

[30] Foreign Application Priority Data

Jun. 30, 1987 [JP] Japan .................. 62-164346
Oct. 6, 1987 [JP] Japan .................. 62-253331
Nov. 17, 1987 [JP] Japan .................. 62-291351

[51] Int. Cl.$^4$ .............................. B05C 1/02
[52] U.S. Cl. ...................... 118/667; 118/52; 118/302; 118/320
[58] Field of Search .......... 118/52, 64, 69, 70, 118/320, 416, 600, 602, 300, 302, 320, 326, 666, 667; 427/240, 372.2, 374.1, 398.1; 264/328.2

[56] References Cited

U.S. PATENT DOCUMENTS

| | | | |
|---|---|---|---|
| 3,356,130 | 12/1967 | Mellen et al. | 425/548 |
| 3,387,992 | 6/1968 | Arthur et al. | 427/240 |
| 3,945,535 | 3/1976 | Leiste et al. | 425/549 |
| 4,113,492 | 9/1978 | Sato et al. | 96/67 |
| 4,416,213 | 11/1983 | Sakiya | 118/302 |
| 4,451,507 | 5/1984 | Beltz et al. | 118/52 |
| 4,510,176 | 4/1985 | Cuthbert et al. | 118/52 |
| 4,564,280 | 1/1986 | Fukuda | 118/52 |
| 4,646,784 | 3/1987 | Leeuwe | 118/52 |
| 4,688,918 | 8/1987 | Suzuki et al. | 118/52 |
| 4,712,994 | 12/1987 | Fierkens et al. | 425/548 |

FOREIGN PATENT DOCUMENTS 61-137322  6/1986  Japan .
61-214520  9/1986  Japan .

Primary Examiner—Willard Hoag
Attorney, Agent, or Firm—Leydig, Voit & Mayer

[57] ABSTRACT

A spin coating apparatus has a refrigerated container which maintains a coating liquid that contains thermosetting materials or thermal crosslinking agents at a temperature which is sufficiently below the temperature of a substrate on which it is to be coated such that the coating liquid will not set. A heat exchanger heats the coating liquid from the reduced temperature of the refrigerated container to the temperature of the substrate just before the coating liquid is applied to the substrate.

8 Claims, 6 Drawing Sheets

SPIN COATING APPARATUS

BACKGROUND OF THE INVENTION

This invention relates to a spin coating apparatus for forming a thin film of a coating liquid, such as a photoresist, on the surface of a semiconductor substrate.

In the manufacture of semiconductor devices, it is necessary to form coatings of various chemicals, such as photoresists, on the surfaces of semiconductor substrates. The most commonly used method is the spin coating method in which a liquid chemical, referred to as a coating liquid, drips from a nozzle onto the center of the top surface of a substrate. The substrate is then rotated about its center, and centrifugal force causes the drops of coating liquid to spread outwards over the surface of the substrate and form a coating.

Some of coating liquids for use in spin coating contain thermosetting materials or thermal crosslinking agents, many of which begin to set at room temperature (20°–25° C.). Spin coating is usually performed at room temperature, and frequently, the coating liquid is stored at room temperature prior to use. However, if the coating liquid is stored at room temperature, its viscosity will gradually increase over time. As the thickness of the coating which is formed by spin coating depends on the viscosity of the coating liquid, the increase in the viscosity of the coating liquid makes it impossible to maintain a constant coating thickness. Furthermore, the coating liquid beings to set at room temperature within the piping which supplies the coating liquid to the nozzle, and the piping and the nozzle can become clogged by the coating liquid.

In order to solve this problem, it is conceivable to cool the entire spin coating apparatus to a temperature below room temperature at which the coating liquid will not begin to set. However, this leads to a large increase in operating costs and is impractical. Another possible method of preventing the coating liquid from setting is to cool only those parts of the spin coating apparatus which come into contact with the coating liquid prior to its application to a substrate (such as a reservoir for storing the coating liquid, the nozzle through which the coating liquid is applied, and piping leading from the reservoir to the nozzle) while the other portions of the spin coating apparatus are maintained at room temperature. However, with this method, the coating liquid which is applied to the substrate by the nozzle is at a lower temperature than the substrate, which is at room temperature. In spin coating, if the temperature of the coating liquid is different from the temperature of the substrate to which it is applied, a coating with a uniform thickness can not be formed.

SUMMARY OF THE INVENTION

Accordingly, it is an object of the present invention to provide a spin coating apparatus which can prevent the viscosity of a coating liquid from varying over time so that coatings of a constant thickness can be formed on substrates.

It is another object of the present invention to provide a spin coating apparatus which can prevent piping and nozzles from becoming clogged by a coating liquid.

It is yet another object of the present invention to provide a spin coating apparatus which can form coatings of a uniform thickness.

A spin coating apparatus is equipped with a refrigerated container which maintains the temperature of a coating liquid that contains thermosetting materials or thermal crosslinking agents, such as a photoresist, below the temperature of the substrate to which it is to be applied while it is being stored so that its viscosity will not change. Just prior to being supplied to a nozzle by means of which the coating liquid is applied to a substrate, the coating liquid is passed through a heater which raises the temperature of the coating liquid to the temperature of the substrate. As a result, the viscosity of the coating liquid does not vary over time, so a constant coating thickness can be obtained. As the coating liquid is prevented from setting prior to application, the spin coating apparatus does not become clogged up with the coating liquid.

A spin coating apparatus in accordance with the present invention comprises means for rotating a substrate in the plane of the substrate, liquid dispensing means for dispensing a coating liquid onto the substrate, a source of coating liquid to be applied to the substrate, means for maintaining the source of coating liquid at a temperature which is sufficiently below the temperature of the substrate such that the coating liquid will not set, supply means for supplying coating liquid from the source of coating liquid to the dispensing means, and heating means for heating the coating liquid to the temperature of the substrate before it is supplied to the dispensing means.

In preferred embodiments, the dispensing means is a nozzle, the supply means is supply piping which connects the source of coating liquid with the nozzle, and the heating means is a heat exchanger which is mounted on the supplying piping and which exchanges heat with the atmosphere.

The heating means can also include auxiliary heating means for increasing the rate of heating of the coating liquid in the heat exchanger. In a preferred embodiment, the auxiliary heating means is a fan which blows air over a heat exchanger.

There is no restriction on the temperature of the substrate when spin coating is performed or on the temperature of the heat exchanger, but in preferred embodiments, both the substrate and the heat exchanger are at room temperature.

The spin coating apparatus of the present invention may also include a source of a solvent which is capable of dissolving the coating liquid. The source of solvent can be connected to the supply piping leading to the nozzle through a valve. By passing the solvent through the supply piping and the nozzle, any coating liquid remaining therein can be washed away so that the piping and nozzle will not become clogged with coating liquid.

BRIEF DESCRIPTION OF THE DRAWINGS

In the figures, the same reference numerals indicate the same or corresponding parts.

DESCRIPTION OF THE PREFERRED EMBODIMENTS

Figure 1:
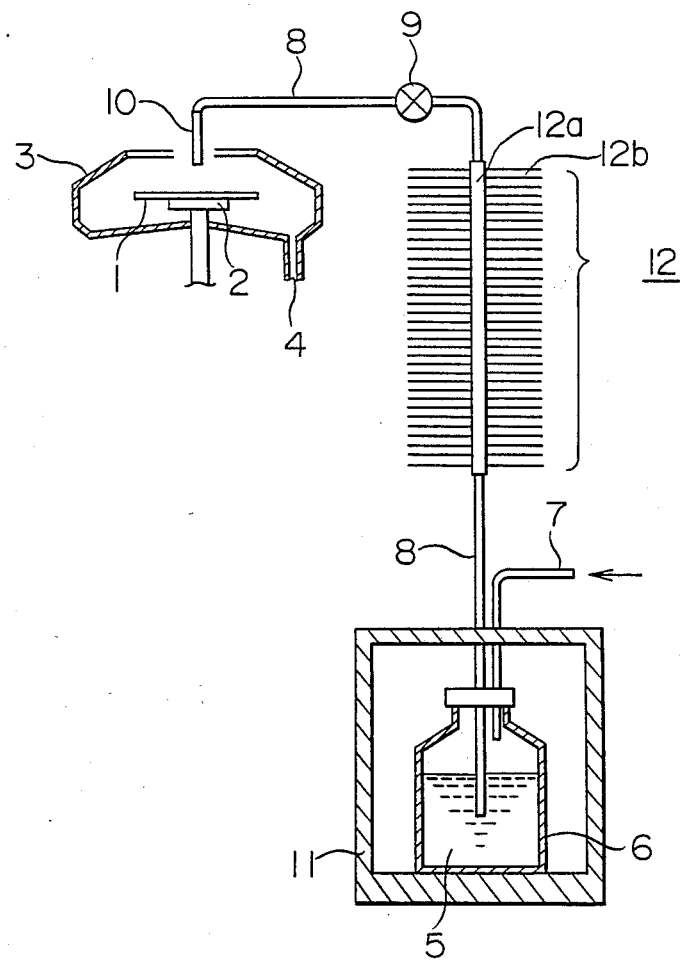
FIG. 1 is a schematic illustration of a first embodiment of a spin coating apparatus in accordance with the present invention.

Hereinbelow, a number of preferred embodiments of a spin coating apparatus in accordance with the present invention will be described while referring to the accompanying drawings, FIG. 1 of which illustrates a first embodiment. As shown in this figure, a semiconductor substrate 1 in the form of a silicon wafer is securely mounted atop a rotatable vacuum chuck 2. The substrate 1 can be rotated in its own plane by an unillustrated motor which is connected to the vacuum chuck 2. The substrate 1 and the vacuum chuck 2 are housed inside a spin coating chamber 3 which is equipped with a discharge drain 4 in the bottom thereof through which excess coating liquid can drain. The substrate 1 is at room temperature.

A coating liquid 5 in the form of a thermosetting resin such as a photoresist which is to be applied to the top surface of the substrate 1 is housed within a sealed storage bottle 6, which in turn is housed within a refrigerated container 11. The refrigerated container 11 maintains the coating liquid 5 at a reduced temperature which is sufficiently below the temperature of the substrate 1, i.e., room temperature, such that the coating liquid 5 will not begin to set and can be stored at this temperature with no change in its viscosity. An intake pipe 7 for a pressurized gas extends into the storage bottle 6 with its lower end above the surface of the coating liquid 5. The other end of the intake pipe 7 is connected to an unillustrated source of pressurized gas. One end of a coating liquid supply pipe 8 extends into the storage bottle 6 and is immersed in the coating liquid 5. The other end of the supply pipe 8 has a liquid dispenser in the form of a coating nozzle 10 mounted thereon. The coating nozzle 10 is disposed above the top surface of the substrate 1. A heat exchanger 12 is installed on the supply pipe 8 between the refrigerated container 11 and the nozzle 10. The heat exchanger 12 comprises a heat exchange pipe 12a and a plurality of heat exchange plates 12b which are secured to the outer surface of the heat exchange pipe 12a. The heat exchange pipe 12a and the heat exchange plates 12b are made of a metal having good thermal conductivity such as stainless steel, although any other suitable material having good thermal conductivity can be employed. The heat exchanger 12 constitutes heating means for raising the temperature of the coating liquid 5 to the temperature of the substrate 1. The air surrounding the heat exchanger 12 is at the same temperature as the substrate 1, i.e., room temperature. A solenoid valve 9 for controlling the supply of coating liquid 5 to the nozzle 10 is connected to the supply pipe 8 between the heat exchanger 12 and the nozzle 10. To prevent the coating liquid 5 from setting while it is in the section of the supply pipe 8 between the heat exchanger 12 and the coating nozzle 10, it is desirable that this section of the supply pipe 8 be as short as possible to decrease the length of time during which the coating liquid 5 is at room temperature. The coating nozzle 10 may be mounted immediately downstream of the solenoid valve 9.

The operation of this embodiment is as follows. When the solenoid valve 9 is opened by an external signal, the pressurized gas which is introduced into the storage bottle 6 through the intake pipe 7 forces a portion of the coating liquid 5 into the supply pipe 8. At this point, the coating liquid 5 is at a reduced temperature at which it will not set. As the coating liquid 5 flows through the heat exchanger 12, its temperature is gradually raised to room temperature by heat exchange with the atmosphere. After passing through the heat exchanger 12, the coating liquid 5 passes through the solenoid valve 9 and is applied drop-by-drop onto the top surface of the substrate 1 through the coating nozzle 10. The amount of coating liquid 5 which is applied to the substrate 1 is determined by the length of time the solenoid valve 9 is left open. When a suitable quantity of coating liquid 5 has been applied to the substrate 1, the solenoid valve 9 is then closed, the substrate 1 is rotated by the vacuum chuck 2, and the coating liquid 5 spreads over the surface of the substrate 1 to form a thin coating.

While the substrate 1 is spinning and the solenoid valve 9 is closed, coating liquid 5 at a reduced temperature which remains within the heat exchanger 12 absorbs heat from the atmosphere and its temperature rises to near room temperature. The magnitude of the temperature increase of the coating liquid 5 within the heat exchanger 12 is determined by the length of the heat exchange pipe 12a, the surface area of the heat exchange plates 12b, and the rate at which coating liquid 5 passes through the heat exchanger 12, which is determined by the opening and closing times of the solenoid valve 9. By suitable controlling these parameters, it is possible to ensure that the temperature of the coating liquid 5 which leaves the nozzle 10 always equals the temperature of the substrate 1.

Since the coating liquid 5 is maintained at a low temperature at which setting does not progress until just prior to being applied to a substrate, it does not clog the supply pipe 8 or the nozzle 10 by setting. In addition, as the viscosity of the coating liquid 5 is maintained constant during storage due to its being stored at a reduced temperature, the thickness of coatings formed by the apparatus does not vary over time. Furthermore, as the coating liquid 5 is at the temperature of the substrate 1 when applied thereto, a coating whose thickness is uniform over the entire area of the substrate 1 can be formed.

Figure 2:
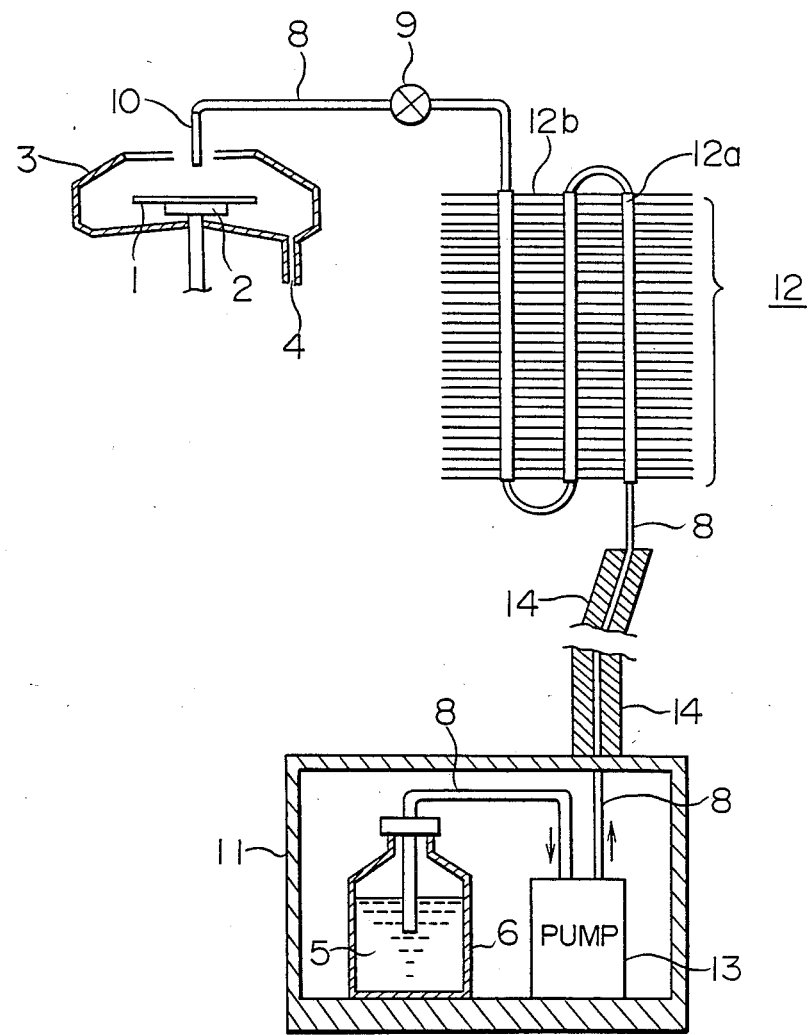
FIG. 2 is a schematic illustration of a second embodiment of the present invention.

FIG. 2 illustrates a second embodiment of the present invention. In this embodiment, a cooling device in the form of a cooling jacket 14 is installed on the portion of a supply pipe 8 between a refrigerated container 11 and a heat exchanger 12. The cooling jacket 14 maintains the coating liquid 5 passing through this portion of the supply pipe 8 at the temperature of the coating liquid 5 within the refrigerated container 11. In some cases, due to space considerations, the length of the supply pipe 8 between the refrigerated container 11 and the heat exchanger 12 may become quite long, and if this section of the supply pipe 8 were exposed to the atmosphere, some setting of the coating liquid 5 passing through it might occur. However, the cooling jacket 14 prevents the coating liquid 5 from setting by maintaining it at a reduced temperature until it enters the heat exchanger 12.

Instead of employing gas pressure to force coating liquid 5 from a storage bottle 6 into the supply pipe 8, in this embodiment, a pump 13 is employed. The pump 13 is disposed within the refrigerated container 11 and is connected to the supply pipe 8 between the storage bottle 6 and the cooling jacket 14. In order to save space, the heat exchanger pipe 12a of the heat exchanger 12 is bent into the shape of an S. The structure of this embodiment is otherwise the same as that of the embodiment of FIG. 1, and the same advantages are obtained.

Figure 3:
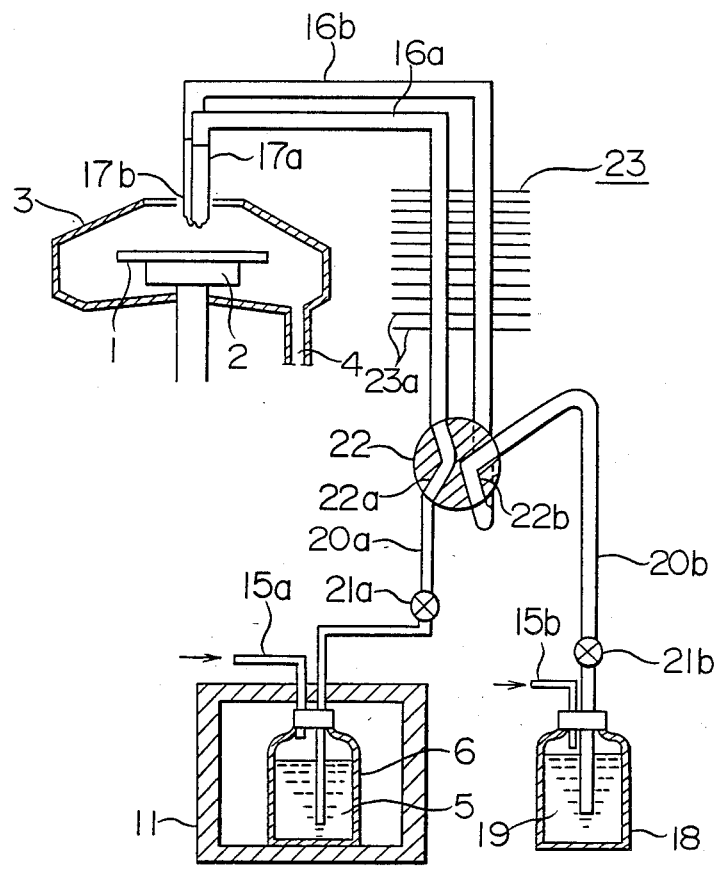
FIG. 3 is a schematic illustration of a third embodiment of the present invention which is equipped with two nozzles and a source of a solvent for dissolving the coating liquid within the supply pipes.

FIG. 3 illustrates a third embodiment of the present invention. As in the previous embodiments, a substrate 1 is mounted on a vacuum chuck 2 within a spin coating chamber 3. A sealed storage bottle 6 containing a coating liquid 5 is housed within a refrigerated container 11 which maintains the coating liquid 5 at a reduced temperature at which setting will not take place. An intake pipe 15a for introducing pressurized gas into the storage bottle 6 extends into the storage bottle 6 with its lower end above the surface of the coating liquid 5, and a coating liquid supply pipe 20a also extends into the storage bottle 6 with its lower end submerged in the coating liquid 5. The intake pipe 15a is connected to an unillustrated source of pressurized gas. The other end of the coating liquid supply pipe 20a is connected to a four-way valve 22. A solenoid valve 21a is installed along the coating liquid supply pipe 20a between the storage bottle 6 and the four-way valve 22.

A sealed storage bottle 18 contains a solvent 19 is disposed outside the refrigerated container 11. The solvent 19 is one which is able to dissolve the coating liquid 5. An intake pipe 15b for introducing pressurized gas extends into the storage bottle 18 with its lower end above the surface of the solvent 19, and a solvent supply pipe 20b extends into the storage bottle 18 with its lower end submerged in the solvent 19. The intake pipe 15b is connected to an unillustrated source of pressurized gas. The other end of the solvent supply pipe 20b is connected to the four-way valve 22. A solenoid valve 21b is installed on the solvent supply pipe 20b between the storage bottle 18 and the four-way valve 22.

The four-way valve 22 is also connected to the ends of a first upper supply pipe 16a and a second upper supply pipe 16b. The other ends of the upper supply pipes 16a and 16b are respectively connected to a first coating nozzle 17a and a second coating nozzle 17b which are disposed above the surface of the substrate 1. The coating nozzle 17a and 17b can be moved above the substrate to desired positions. A heat exchanger 23 comprising a plurality of heat exchange plates 23a is installed on the outside of the upper supply pipes 16a and 16b between the four-way valve 22 and the coating nozzles 17a and 17b. The heat exchanger 23 and the substrate 1 are both at room temperature.

Figure 4A:
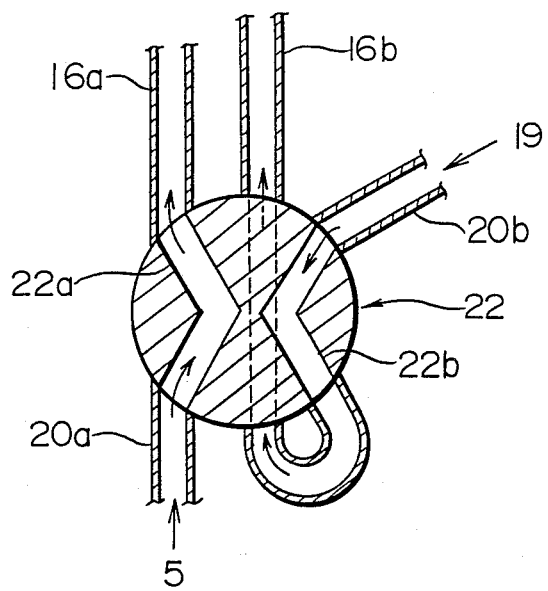
FIGS. 4A and 4B are schematic illustrations of the fourway valve of FIG. 3 during two different modes of operation.
Figure 4B:
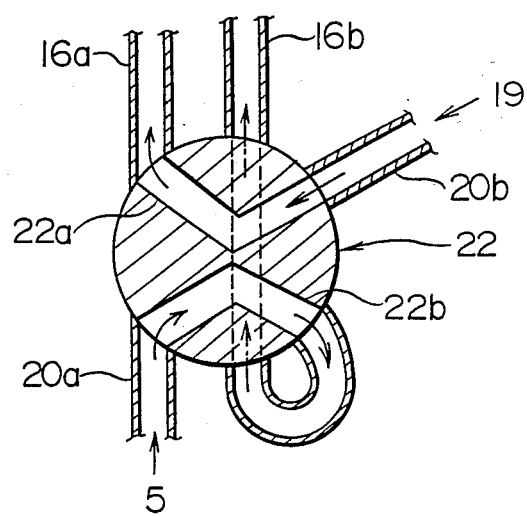

The structure of the four-way valve 22 is schematically illustrated in FIGS. 4A and 4B. As shown in these figures, the rotating portion of the four-way valve 22 has a first internal passageway 22a and a second internal passageway 22b formed therein. The valve 22 can be rotated 90° between a first position and a second position. In the first position, shown in FIG. 4A, the coating supply pipe 20a is connected to the first upper supply pipe 16a by the first internal passageway 22a, and the solvent supply pipe 20b is connected to the second upper supply pipe 16b by the second internal passageway 22b. In the second position, shown in FIG. 4B, the coating liquid supply pipe 20a is connected to the second upper supply pipe 16b by the second internal passageway 22b, and the solvent supply pipe 20b is connected to the first upper supply pipe 16a by the first internal passageway 22a.

The operation of this embodiment is as follows. Both solenoid valves 21a and 21b are initially shut, the first coating nozzle 17a is positioned above the substrate 1, and the four-way valve 22 is in its first position, as shown in FIGS. 3 and 4A. If solenoid valve 21a is then opened, coating liquid 5 at a reduced temperature from storage bottle 6 will be introduced by gas pressure into the first upper supply pipe 16a via coating liquid supply pipe 20a and internal passageway 22a of the four-way valve 22. As the coating liquid 5 passes through the portion of the first upper supply pipe 16a on which the heat exchanger 23 is mounted, the coating liquid 5 will absorb heat from the atmosphere through the heat exchange plates 23a and will be warmed to room temperature. The coating liquid 5 is then applied to the top surface of the substrate 1 by the first coating nozzle 17a, and after solenoid valve 21a is closed, the substrate 1 is rotated by the vacuum chuck 2 to form a coating atop the substrate 1 in the same manner as in the previous embodiments.

The first coating nozzle 17a is then moved to a position in which it is no longer directly above the substrate 1. The four-way valve 22 is turned to its second position, illustrated in FIG. 4B, in which the first upper supply pipe 16a communicates with the solvent supply pipe 20b. If solenoid valve 21b is then opened, solvent 19 from the solvent storage bottle 18 will be introduced into the solvent supply pipe 20b by gas pressure, will flow through the first internal passageway 22a and the first upper supply pipe 16a, and will be discharged from the first coating nozzle 17a. As the solvent 19 flows through the pipes and the first nozzle 17a, any coating liquid 5 remaining therein will be dissolved and washed away, thereby preventing the coating liquid 5 from clogging the apparatus. After cleaning is performed using the solvent 19, solenoid valve 21b is closed, the four-way valve 22 is switched back to its first position, and the above procedure is repeated.

In the above-described mode of operation, solenoid valve 21a is kept closed when the four-way valve 22 is in the second position and the solvent 19 is flowing through the first upper supply pipe 16a and the first coating nozzle 17a. However, at this time, if the second coating nozzle 17b is moved to a position above the substrate 1 and solenoid valve 21a is opened, coating liquid 5 can be applied to the substrate 1 through the second upper supply pipe 16b and the second coating nozzle 17b at the same time that the first upper supply pipe 16a and the first coating nozzle 17a are being cleaned. Coating liquid 5 which is supplied to the second coating nozzle 17b through the second upper supply pipe 16b is heated to room temperature as it passes through the heat exchanger 23. Then, when the four-way valve 22 is in the first position of FIG. 3, by opening solenoid valve 21b, the second upper supply pipe 16b and the second coating nozzle 17b can be cleaned while the first upper supply pipe 16a and the first coating nozzle 17a are being used to supply coating liquid 5 to a substrate 1. In this manner, cleaning of piping and spin coating of a substrate 1 can be performed continuously and simultaneously. This mode of operation is particularly suitable when employing a coating liquid 5 which undergoes rapid thermosetting. When either of the coating nozzles 17a or 17b is being cleaned, it is moved sideways to a position such that it is not directly above the substrate 1 so that the solvent 19 which is discharged therefrom will not fall onto the substrate 1.

Figure 5A:
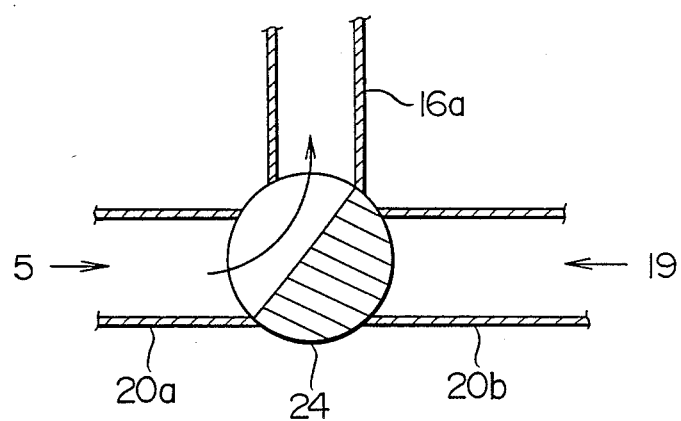
FIGS. 5A and 5B are schematic illustrations of a three-way valve of a fourth embodiment of the present invention during two different modes of operation.
Figure 5B:
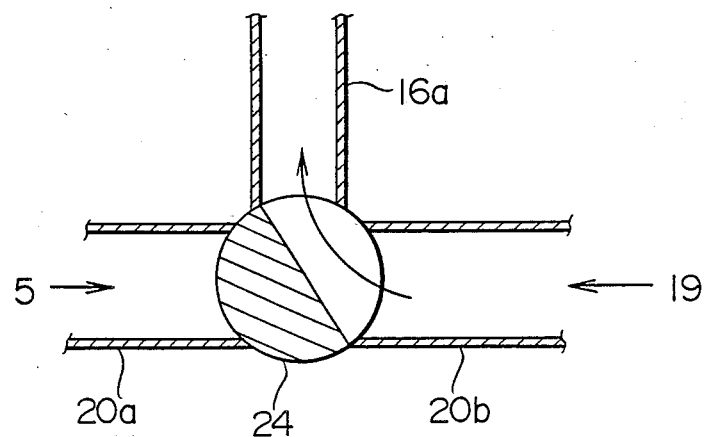

FIGS. 5A and 5B illustrate a portion of a fourth embodiment of the present invention. In this embodiment, the four-way valve 22 of FIG. 3 is replaced by a three-way valve 24 which is connected to a coating liquid supply pipe 20a, a solvent supply pipe 20b, and a single upper supply pipe 16a having an unillustrated coating nozzle mounted on the opposite end thereof. The structure of this embodiment is otherwise similar to that of the embodiment of FIG. 3. The three-way valve 24 can be rotated between a first position shown in FIG. 5A and a second position shown in FIG. 5B. In the first position, the coating liquid supply pipe 20a communicates with the upper supply pipe 16a while the solvent supply pipe 20b is closed off. In the second position, the solvent supply pipe 20b communicates with the upper supply pipe 16a while the coating liquid supply pipe 20a is closed off. When the three-way valve 24 is turned to the first position of FIG. 5A, coating liquid 5 is applied to the top surface of an unillustrated substrate through the upper supply pipe 16a, and when the three-way valve 24 is turned to the second position of FIG. 5B, solvent 19 flows into the upper supply pipe 16a and the nozzle and washes away any coating liquid 5 remaining therein. This embodiment provides the same benefits as do the preceding embodiments.

In each of the preceding embodiments, the temperature of the coating liquid 5 is raised to room temperature in a heat exchanger by heat exchange with stationary air. Although the dimensions of the heat exchanger can be selected to provide adequate heating of the coating liquid for a given flow rate through the heat exchanger, if the rate at which the coating liquid is supplied to the coating nozzle is increased, the rate of heat exchange may be inadequate, especially since the heat transfer between a solid (the heat exchanger) and a gas (the atmosphere) is poor. Therefore, the temperature of the coating liquid after passing through the heat exchanger may fall below room temperature, resulting in nonuniform coatings being formed on the substrates.

Figure 6:
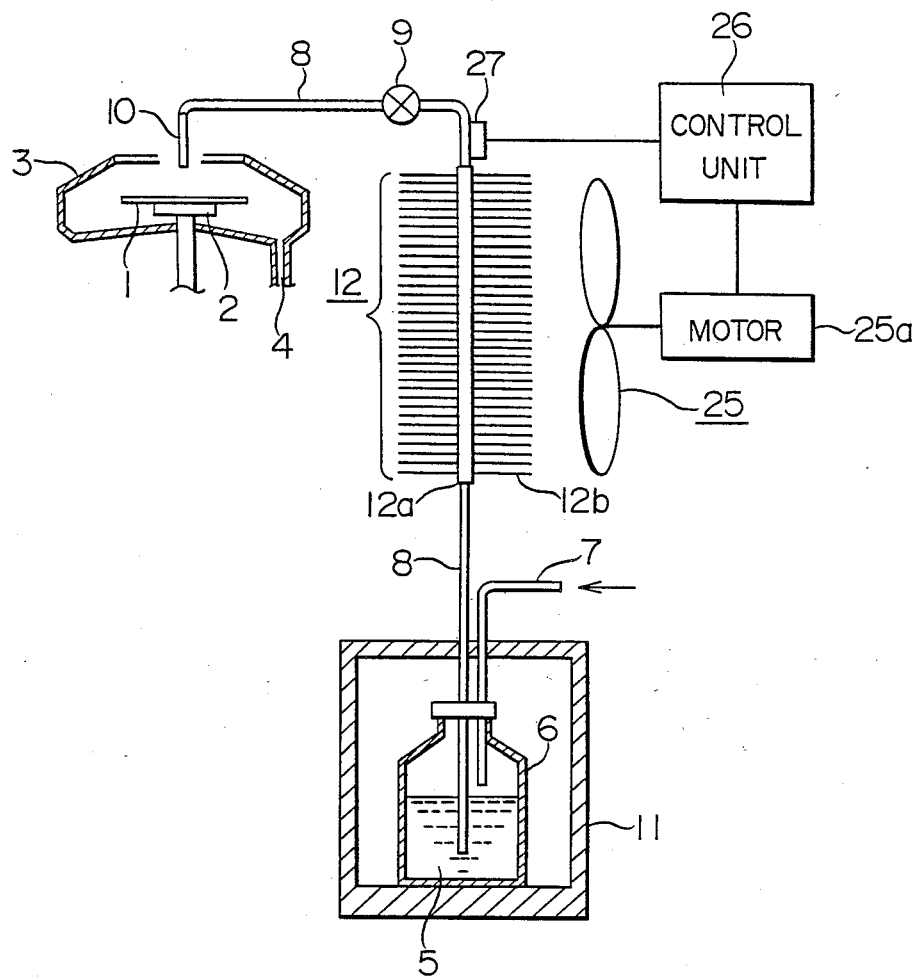
FIG. 6 is a schematic illustration of a fifth embodiment of the present invention which is equipped with an auxiliary heating mechanism.

FIG. 6 illustrates a fifth embodiment of the present invention which solves this problem. The overall structure of this embodiment is similar to that of the embodiment of FIG. 1. It is further equipped with an auxiliary heating means in the form of a fan 25 which is disposed to blow air at room temperature over the heat exchanger 12. A temperature sensor 27 is mounted on the outside of a supply pipe 8 just upstream of a heat exchanger 12. The temperature sensor 27 detects the temperature of the coating liquid 5 discharged from the heat exchanger 12 and produces a corresponding electrical output signal which is input to the control unit 26. Based on the input from the sensor 27, the control unit 26 controls the operation of the motor 25a of the fan 25. When the temperature which is detected by the temperature sensor 27 falls below a prescribed level, the control unit 26 turns on the fan motor 25a, and the fan 25 blows air at room temperature past the heat exchanger 12. As a result, the rate of heat exchange between the atmosphere and the coating liquid 5 within the heat exchanger 12 is increased, and the temperature of the coating liquid 5 is made to approach room temperature. Therefore, even if the rate at which coating liquid 5 passes through the heat exchanger 12 is increased, the temperature of the coating liquid 5 when it leaves the heat exchanger 12 can always be maintained at room temperature. This embodiment provides the same benefits as the embodiment of FIG. 1.

In the embodiment of FIG. 6, the auxiliary heating means is in the form of a fan 25, but other devices can be used for heating the coating liquid 5. For example, an auxiliary heating means in the form of an electric heater or other temperature regulator could be mounted on the heat exchange plates 12b.

In the embodiments of FIGS. 1, 2, and 6, a solenoid valve 9 is positioned on the downstream side of a heat exchanger 12, but it can be disposed anywhere between the storage bottle 6 for coating liquid 5 and the coating nozzle 10, including inside the refrigerated container 11. Furthermore, although gas pressure is employed in the embodiments of FIGS. 1, 3, and 6 to supply coating liquid 5 or a solvent 19 to coating nozzles, a pump like the one illustrated in FIG. 2 can be used instead.

In addition, the shape of a heat exchanger employed in the present invention is not limited to the shapes illustrated in the figures.

In the preceding description, the coating liquid 5 is a thermosetting substance which begins to set at room temperature, but the present invention can also be employed to apply a coating liquid which begins to set at a temperature below room temperature. Furthermore, in the preceding description, both the substrate 1 and the air surrounding the heat exchanger are at room temperature (approximately 20°–25° C.), but as long as the heat exchanger is capable of heating the coating liquid to the temperature of the substrate, the heat exchanger and the substrate 1 need not be a room temperature or at the same temperature.

What is claimed is:

1. A spin coating apparatus comprising:
    means for rotating a substrate in the plane of the substrate;
    dispensing means for dispensing a coating liquid onto the substrate;
    a reservoir for a thermosetting coating liquid for application to the substrate;
    refrigeration means for maintaining said reservoir and the thermosetting coating liquid at a temperature below the temperature of the substrate and the setting temperature of the thermosetting coating liquid;
    means for transporting the thermosetting coating liquid from said reservoir to said dispensing means; and
    heating means for heating the thermosetting coating liquid during transportation to said dispensing means to the temperature of the substrate before the thermosetting coating liquid is dispensed by said dispensing means onto the substrate.

2. A spin coating apparatus as claimed in claim 1 wherein said dispensing means comprises a first nozzle and a second nozzle which are disposed opposite the substrate;
    said supply means comprises a first supply pipe and a second supply pipe in fluid communication with said first nozzle and said second nozzle, respectively;
    said heating means comprises a heat exchanger disposed on said first and second supply pipes for exchanging heat between surrounding air and the thermosetting coating liquid passing through said first and second supply pipes;
    a second reservoir for a solvent for said thermosetting coating liquid; and a four-way valve which is connected to said first and second supply pipes, said reservoir for a thermosetting coating liquid, and said second reservoir for a solvent between said heat exchanger and said reservoirs, said four-way valve having a first position in which said first supply pipe is in fluid communication with said reservoir for a thermosetting coating liquid and said second supply pipe is in fluid communication with said second reservoir for a solvent, and a second position in which said first supply pipe is in fluid communication with said second reservoir for a solvent and said second supply pipe is in fluid communication with said reservoir for a thermosetting coating liquid.

3. A spin coating apparatus as claimed in claim 1 wherein:
said dispensing means comprises a nozzle which is disposed opposite the substrate;
said means for transporting comprises supply piping which is connected between said nozzle and said reservoir; and
said heating means comprises a heat exchanger which is disposed on said supply piping for exchanging heat between the thermosetting coating liquid passing through said supply piping and surrounding air.

4. A spin coating apparatus as claimed in claim 2 further comprising thermal insulation means for maintaining the thermosetting coating liquid at the temperature below the temperature of the substrate as it flows within said supply piping between said reservoir and said heat exchanger.

5. A spin coating apparatus as claimed in claim 2, wherein said heating means comprises an electric heater mounted on said heat exchanger.

6. A spin coating apparatus as claimed in claim 2 wherein said heating means comprises a fan for blowing air over said heat exchanger.

7. A spin coating apparatus as claimed in claim 5 wherein said heating means comprises:
temperature sensing means for sensing the temperature of the thermosetting coating liquid in said supply piping after exchanging heat with said heat exchanger; and
control means responsive to said temperature sensing means for actuating said fan when the temperature of the thermosetting coating liquid falls below a prescribed temperature.

8. A spin coating apparatus as claimed in claim 2 further comprising:
a second reservoir for a solvent for the thermosetting coating liquid; and
a three-way valve which is connected to said second reservoir for a solvent, to said reservoir for a thermosetting coating liquid, and to said supply piping between said heat exchanger and said reservoirs, said three-way valve having a first position in which said nozzle is in fluid communication with said reservoir for the thermosetting coating liquid and a second position in which said nozzle is in fluid communication with said second reservoir for a solvent.

* * * * *

UNITED STATES PATENT AND TRADEMARK OFFICE
CERTIFICATE OF CORRECTION

PATENT NO.　 : 4,886,012
DATED　　　 : December 12, 1989
INVENTOR(S) : Ikeno et al

It is certified that error appears in the above-identified patent and that said Letters Patent is hereby corrected as shown below:

Col. 7, line 50, change "upstream" to --downstream--.

Col. 1, line 30, change "beings" to --begins--.

Col. 9, line 26, change "2" to --3--.

Col. 10, line 1, change "2" to --3--;
       line 4, change "2" to --3--;
       line 7, change "5" to --6--;
       line 17, change "2" to --3--.

Signed and Sealed this

Twenty-seventh Day of August, 1991

*Attest:*

HARRY F. MANBECK. JR.

*Attesting Officer*　　　　　*Commissioner of Patents and Trademarks*